(12) United States Patent
Hutin et al.

(10) Patent No.: US 11,817,490 B2
(45) Date of Patent: Nov. 14, 2023

(54) METHOD FOR MAKING A QUANTUM DEVICE WITH NUCLEAR SPIN QUBITS

(71) Applicant: COMMISSARIAT A L'ENERGIE ATOMIQUE ET AUX ENERGIES ALTERNATIVES, Paris (FR)

(72) Inventors: Louis Hutin, Grenoble (FR); Julien Borrel, Le Versoud (FR); Raluca Tiron, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 267 days.

(21) Appl. No.: 17/403,215

(22) Filed: Aug. 16, 2021

(65) Prior Publication Data
US 2022/0052179 A1  Feb. 17, 2022

(30) Foreign Application Priority Data
Aug. 17, 2020  (FR) ..................................... 20 08524

(51) Int. Cl.
*H01L 21/265* (2006.01)
*H01L 21/308* (2006.01)
(Continued)

(52) U.S. Cl.
CPC ....... *H01L 29/66439* (2013.01); *G06N 10/00* (2019.01); *H01L 21/26506* (2013.01); *H01L 21/308* (2013.01); *B82Y 40/00* (2013.01)

(58) Field of Classification Search
CPC ........... H01L 21/26506; H01L 21/2652; H01L 21/266; H01L 21/308; H01L 29/36;
(Continued)

(56) References Cited

U.S. PATENT DOCUMENTS 7,799,699 B2 * 9/2010 Nuzzo ............... H01L 21/02628
216/2
8,551,808 B2 * 10/2013 Marsh ................. H01L 21/0276
257/E51.001
(Continued)

OTHER PUBLICATIONS

French Preliminary Search Report dated May 12, 2021 in French Application 20 08524 filed on Aug. 17, 2020, 3 pages (with English Translation of Categories of Cited Documents).
(Continued)

*Primary Examiner* — Omar F Mojaddedi
(74) *Attorney, Agent, or Firm* — Oblon, McClelland, Maier & Neustadt, L.L.P.

(57) ABSTRACT

A method for making a quantum device including:
forming, over a semiconductor layer, a graphoepitaxy guide forming a cavity with a lateral dimension that is a multiple of a period of self-assembly of a di-block copolymer into lamellas;
first deposition of the copolymer in the cavity;
first self-assembly of the copolymer, forming a first alternating arrangement of first lamellas and of second lamellas;
removal of the first lamellas;
implantation of dopants in portions of the semiconductor layer previously covered with the first lamellas;
removal of the second lamellas;
second deposition of the copolymer in the cavity, over a gate material;
second self-assembly of the copolymer, forming a second alternating arrangement of first and second lamellas;
removal of the second lamellas;
etching of portions of the gate material previously covered with the second lamellas.

11 Claims, 7 Drawing Sheets

(51) Int. Cl.
*H01L 21/266* (2006.01)
*H01L 29/66* (2006.01)
*G06N 10/00* (2022.01)
*B82Y 40/00* (2011.01)

(58) Field of Classification Search
CPC ............ H01L 29/423; H01L 29/66439; H01L 29/66977; H01L 29/66984; B29Y 10/00
See application file for complete search history.

(56) References Cited

U.S. PATENT DOCUMENTS

| | | |
|---|---|---|
| 2008/0037101 A1 | 2/2008 | Jagannathan et al. |
| 2011/0081777 A1 | 4/2011 | Yoon et al. |
| 2012/0067843 A1 | 3/2012 | Watanabe et al. |
| 2015/0279661 A1 | 10/2015 | Ban et al. |
| 2018/0358538 A1* | 12/2018 | Brink ................ G06N 10/00 |
| 2019/0013246 A1* | 1/2019 | Wallace ........... H01L 21/823437 |
| 2019/0164959 A1* | 5/2019 | Thomas ................ H01L 29/66 |
| 2019/0266511 A1* | 8/2019 | Pillarisetty ........ H01L 29/66977 |

OTHER PUBLICATIONS

Tosi, et al., "Silicon quantum processor with robust long-distance qubit couplings", Nature Communications, 2017, 11 pages.
Kane, "A silicon-based nuclear spin quantum computer", Nature, vol. 393, May 14, 1998, 5 pages.
Hill et al., "A surface code quantum computer in silicon", Science Advances, Oct. 30, 2015, 12 pages.
Shinada et al., "Enhancing semiconductor device performance using ordered dopant arrays", Nature, vol. 437, Oct. 20, 2005, 4 pages.
Schofield et al., "Atomically Precise Placement of Single Dopants in Si", Physical Review Letters, vol. 91, No. 13, Sep. 26, 2003, 4 pages.
Pla et al., "A single-atom electron spin qubit in silicon", Nature, vol. 489, Sep. 27, 2012, 5 pages.
Koch et al., "Spin read-out in atomic qubits in an all-epitaxial three-dimensional transistor", Nature Nanotechnology, Jan. 7, 2019, 4 pages.
Oria et al., "Guided self-assembly of block-copolymer for CMOS technology: a comparative study between grapho-epitaxy and surface chemical modification", SPIE, vol. 7970, 2011, 10 pages.
U.S. Appl. No. 16/159,923, filed Oct. 15, 2018, 2019/0123183 A1, Hutin, L, et al.
U.S. Appl. No. 16/626,827, filed Dec. 26, 2019, 2020/0226486 A1, Bourdet, L, et al.
U.S. Appl. No. 17/199,610, filed Mar. 12, 2021, Colinge, J, et al.

* cited by examiner

METHOD FOR MAKING A QUANTUM DEVICE WITH NUCLEAR SPIN QUBITS

TECHNICAL FIELD AND PRIOR ART

The technical field of the invention is that of quantum electronics using nuclear spin qubits formed in a semiconductor material. In particular, the invention relates to making a quantum device comprising nuclear spin qubits, this device could form a quantum computer.

The document by B. E. Kane, "A silicon-based nuclear spin quantum computer", Nature 393, 133-137, May 14, 1998, suggests making a quantum computer comprising nuclear spin qubits formed in a silicon layer. The structure of this quantum computer requires making a network of donor atoms, or dopants, of unique phosphorus atoms (that is to say one single donor atom, or dopant, in the semiconductor region of each qubit) spaced apart from one another evenly by a distance equal to about 20 nm and formed in an isotopically-purified silicon 28 layer. Preferably, the donor atoms are disposed at a constant depth in the semiconductor layer. In such a device, each qubit is encoded by the nuclear spin of one of the donor atoms. The silicon layer is covered with a silicon oxide layer serving as a gate oxide. First gates are each formed on top of one of the donor atoms and allow making the nuclear spin of these atoms sensitive, or not, to a magnetic excitation signal supplied by an antenna. Second gates are also positioned over the silicon layer, between the first gates, to control each of the tunnel barriers separating two neighbouring donor atoms.

Improvements of such a quantum computer structure have been suggested, such as those described in the documents C. D. Hill et al., "A surface code quantum computer in silicon", Science Advances, 1, 9 (Oct. 30, 2015) and G. Tosi et al., "Silicon quantum processor with robust long-distance qubit couplings", Nature Communications, 8, 450, Sep. 6, 2017. The structures suggested in these documents include two-dimensional networks of qubits, thereby making these structures compatible with error correction codes. These structures become more and more complex to integrate charge or long-range coupling detectors.

For all these structures, the main difficulty in making thereof lies in the accurate implantation of the dopants that has to be implemented in the semiconductor layer, and in making of the control gates that have to be made accurately, that is to say aligned, on top of the dopants.

The document by T. Shinada et al., "Enhancing semiconductor device performance using ordered dopant arrays", Nature 437, 1128-1131 (Oct. 20, 2005) describes a method for forming orderly arrangements of unique dopants in a semiconductor layer, during which an ion beam is truncated to carry out implantations of unique dopants with an accuracy of about 100 nm with respect to the targeted locations. Afterwards, a gate is formed by covering the entirety of the formed dopant matrix. This method does not allow forming several control gates each accurately disposed on top of one of the dopants.

The document by S. R. Schofield et al., "Atomically Precise Placement of Single Dopants in Si", Phys. Rev. Lett. 91, 136104, Sep. 25, 2003, suggests, for carrying out an implantation of unique dopants in a silicon layer, passivating at first the surface of the silicon layer with hydrogen atoms. Afterwards, the tip of a scanning tunnelling microscope (STM) is used to eliminate the hydrogen bonds one after another at each of the locations desired for the dopants. Afterwards, the silicon layer is exposed to $PH_3$ which binds on the region of the layer where the hydrogen bonds have been eliminated. Afterwards, the P atom diffuses in the silicon during an annealing implemented at a temperature lower than that of desorption of the hydrogen bonds. All these steps are carried out in the enclosure of the scanning tunnelling microscope. Although this method allows for a very accurate placement of the dopants in silicon, it is also extremely slow, which makes it incompatible with an industrial implementation because of the very low production yield that could be obtained with this method.

The document by J. J. Pla et al., "A single-atom electron spin qubit in silicon", Nature 489, 541-545, Sep. 27, 2012, describes making of a spin qubit of an electron bound to a phosphorus atom in silicon. For this purpose, an ion implantation of phosphorus is carried out within a window whose dimensions are equal to 90×90 $nm^2$ defined by electron lithography in a PMMA (poly(methyl methacrylate)) mask. The implantation is implemented with an adjusted dose so that one or a few dopant(s) reach(es) the cavity formed by the window. Afterwards, the gate level is realized by aligning the gates with alignment markings used during the implantation. Nonetheless, with this method, a good alignment between the dopants and the gates is difficult to achieve.

The document by M. Koch et al., "Spin read-out in atomic qubits in an all-epitaxial three-dimensional transistor", Nature Nanotechnology, Jan. 7, 2019, describes a method in which the lithography by STM is used not only to locate unique dopants in a silicon layer, but also to form electrodes (in the form of P-doped silicon monolayers) over several layers. An epitaxial silicon layer separates the unique dopant device from an upper gate. Etched markings allow achieving an alignment with an accuracy of about 5 nm between the patterns of the different layers. This method is very accurate but still very slow, which makes it incompatible with an industrial implementation.

DISCLOSURE OF THE INVENTION

The present invention aims to provide a method for making a quantum device with nuclear spin qubits devoid of the drawbacks of the previously-described methods, that is to say allowing obtaining a very good alignment between implanted dopants, or donor atoms, and control gates formed on top of the dopants, which can be implemented on an industrial scale, and which is compatible with making of linear or two-dimensional networks of qubits so that the obtained device is compatible with error correction codes.

For this purpose, a method for making a quantum device with nuclear spin qubits is provided, including the implementation of the following steps:

- forming, over one face of a semiconductor layer, a graphoepitaxy guide, or assembly guide, forming at least one cavity;
- first deposition of a block copolymer in the cavity of the graphoepitaxy guide;
- first self-assembly of the block copolymer, forming in the cavity of the graphoepitaxy guide a first arrangement of at least one first pattern formed by a first phase of the block copolymer and at least one second pattern formed by a second phase of the block copolymer;
- removal of the first pattern of the first arrangement, or removal of the first phase of the block copolymer of the first arrangement;
- implantation of dopants in portions of the semiconductor layer uncovered upon removal of the first pattern of the first arrangement;

removal of the second pattern of the first arrangement, or removal of the second phase of the block copolymer of the first arrangement;

second deposition of the given block copolymer in the cavity of the graphoepitaxy guide, covering at least a gate material formed over the semiconductor layer between the removal of the second pattern of the first arrangement and the second deposition of the block copolymer, or before forming the graphoepitaxy guide;

second self-assembly of the block copolymer, forming in the cavity of the graphoepitaxy guide a second arrangement of at least one first pattern formed by the first phase of the block copolymer and of a second pattern formed by the second phase of the block copolymer, similar to those of the first arrangement;

removal of the second pattern of the second arrangement, or removal of the second phase of the block copolymer of the second arrangement;

etching of first portions of the gate material uncovered upon removal of the second pattern of the second arrangement, such that remaining second portions of the gate material located beneath the first pattern of the second arrangement form gates for controlling the qubits;

removal of the first pattern of the second arrangement, or removal of the first phase of the block copolymer of the second arrangement.

This method suggests the use of the directed self-assembly ("DSA") properties of block copolymers, and graphoepitaxy to achieve a self-alignment between the locations of implantation of the dopants and the locations of the control gates of the qubits. This self-alignment is achieved thanks to the successive making of two similar arrangements of patterns of a block copolymer obtained by two successive self-assemblies of the block copolymer in the same graphoepitaxy guide. Because the shape and the dimensions of the guide are similar during both self-assemblies, the obtained two arrangements of patterns are also similar. The patterns of the two arrangements are wisely used to successively form a mask for implanting the dopants and an etching mask for forming the control gates. Hence, the self-assembly properties of the block copolymer guarantee the obtainment of a self-alignment between the implanted dopants and the formed control gates.

Furthermore, this method is compatible with an industrial implementation, in contrast with the methods of the prior art which have to be implemented in a STM.

The directed self-assembly of the block copolymer allows generating patterns at a very high resolution and at a high density. Thus, for example, this method allows making qubits spaced apart from one another by a distance equal to about 40 nm, and for example made in the form of a two-dimensional matrix, thereby making the device compatible with the implementation of error correction codes.

A block copolymer is a polymer wherein several repeating units of monomers, for example a monomer A and a monomer B in the case of a di-block copolymer, form chains that are bound together by a covalent bond. By conferring enough mobility on the chains, for example by heating this block copolymer, the chains of the monomers A tend to separate into phases or blocks and to reorganise in specific conformations, which depend in particular on the ratio between the monomers. For example, the ratio between the monomer A and the monomer B of a di-block copolymer may be adapted so that the self-assembly of the chains produces first and second phases disposed in the form of an alternating arrangement of lamellas of the monomer A and lamellas of the monomer B.

Details of the implementation of self-alignment of block copolymers are described for example in the document "Guided self-assembly of block-copolymer for CMOS technology: a comparative study between grapho-epitaxy and surface chemical modification", L. Oria et al., SPIE 2011, Vol. 7970-24.

The block copolymer may be a di-block copolymer.

The cavity may include, in a plane parallel to the face of the semiconductor layer over which the guide is formed, a lateral dimension equal to a multiple of a period of self-assembly into lamellas of the block copolymer, and wherein the first and second arrangements correspond to alternating arrangements of first lamellas corresponding to the first pattern and of second lamellas corresponding to the second pattern.

The cavity of the graphoepitaxy guide may have a rectangular-shaped section, in the plane parallel to the face of the semiconductor layer.

The semiconductor layer may be disposed over a substrate, and the method may further include, before making the graphoepitaxy guide, an etching of the semiconductor layer such that at least one remaining portion of the semiconductor layer forms a nanowire having a largest dimension that is parallel to the lateral dimension of the cavity.

Nonetheless, it is possible not to etch the semiconductor layer to form a nanowire, in particular when non-lamellar copolymers are used.

Furthermore, the performed implantation of dopants could be adapted to forming of quantum dots.

In this case, the method may further include the implementation of a doping of portions of the semiconductor layer different from those uncovered upon removal of the first pattern of the first arrangement. This doping may be used to form the carrier reservoirs between which the quantum dots (control gates+implanted dopants) forming the qubits are disposed.

The first self-assembly and/or the second self-assembly of the given block copolymer may include the implementation of an annealing of the block copolymer. In particular, this annealing is implemented in heat and over a time period causing the assembly of the block copolymer. Hence, these annealing parameters directly depend on the selected block copolymer.

The implantation of dopants may include the implementation of an ion implantation.

The gate material may be formed over the semiconductor layer between the removal of the second pattern of the first arrangement and the second deposition of the given block copolymer and may include polysilicon, or the gate material may be formed over the semiconductor layer before forming of graphoepitaxy guide and may include polysilicon and/or a metallic material whose thickness is such that the implantation of dopants could be carried out through the gate material. In the case where the gate material is formed over the semiconductor layer before the graphoepitaxy guide is formed, the material(s) used to form the gate material and the thickness(es) of this/these material(s) is/are selected such that the implantation of dopants could be carried out through this or these gate material(s). Advantageously, the metallic material may consist of a superconductor material, for example TiN whose thickness is smaller than or equal to about 10 nm.

The method may include a deposition of a hard mask layer over the gate material before the second deposition of the block copolymer, and the method may further include, between the removal of the second pattern of the second arrangement and the etching of the first portions of the gate material, an etching of portions of the hard mask layer previously covered with the second pattern of the second arrangement.

The semiconductor layer may include isotopically-purified silicon 28.

The dopants implanted in the first portions of the semiconductor layer may correspond to phosphorus atoms.

BRIEF DESCRIPTION OF THE DRAWINGS

The present invention will be better understood upon reading the description of some embodiments provided for merely indicative and non-limiting purposes with reference to the appended drawings wherein.

Identical, similar or equivalent portions of the different figures described hereinafter bear the same reference numerals in order to facilitate switching from one figure to another.

To make the figures more readable, the different portions shown in the figures are not necessarily according to a uniform scale.

The different possibilities (variants and embodiments) should be understood as not excluding each other and could be combined together.

DETAILED DISCLOSURE OF PARTICULAR EMBODIMENTS

A method for making a quantum device 100 with nuclear spin qubits according to a particular embodiment is described hereinbelow with reference to FIGS. 1 to 14.

The device 100 is made from a semiconductor layer in which the nuclear spin qubits will be made in the form of quantum dots. Advantageously, the semiconductor of this layer is silicon, and in particular isotopically-purified $^{28}$Si. For example, $^{28}$Si is obtained by epitaxy using a silane precursor $^{28}$SiH$_4$ obtained for example by centrifugation of SiF$_4$ into $^{28}$SiF$_4$, and then by reduction of $^{28}$SiF$_4$ into $^{28}$SiH$_4$.

The semiconductor layer is herein disposed over a substrate 102 comprising a dielectric and electrically-insulating material, for example SiO$_2$. For example, the semiconductor layer may correspond to the silicon surface layer of a SOI (silicon on insulator) substrate.

Figure 1:
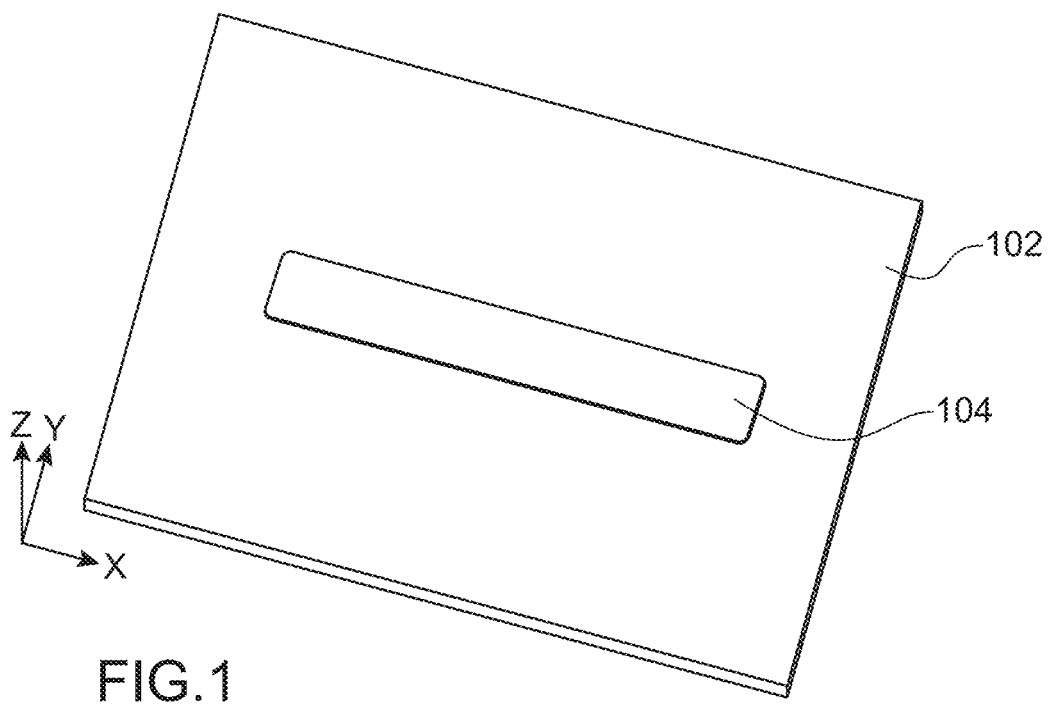
FIGS. 1 to 14 show the steps of a method for making a quantum device with nuclear spin qubits according to a particular embodiment.

In the particular embodiment described herein, the semiconductor layer is etched, for example by implementing a photolithography and then an etching of this layer, such that at least one remaining portion of the layer forms a nanowire 104 (cf. FIG. 1). In FIG. 1, the nanowire 104 includes a larger dimension parallel to the axis X. The dimensions of the nanowire 104, in a plane parallel to the face of the substrate 102 over which lies the nanowire 104 (a plane parallel to the plane (X,Y) in FIG. 1), are for example between about 100 nm and 10 µm. In addition, the thickness of the semiconductor layer, and therefore of the nanowire 104, is for example between about 5 nm and 20 nm.

Alternatively, it is possible not to etch the semiconductor layer.

Figure 2:
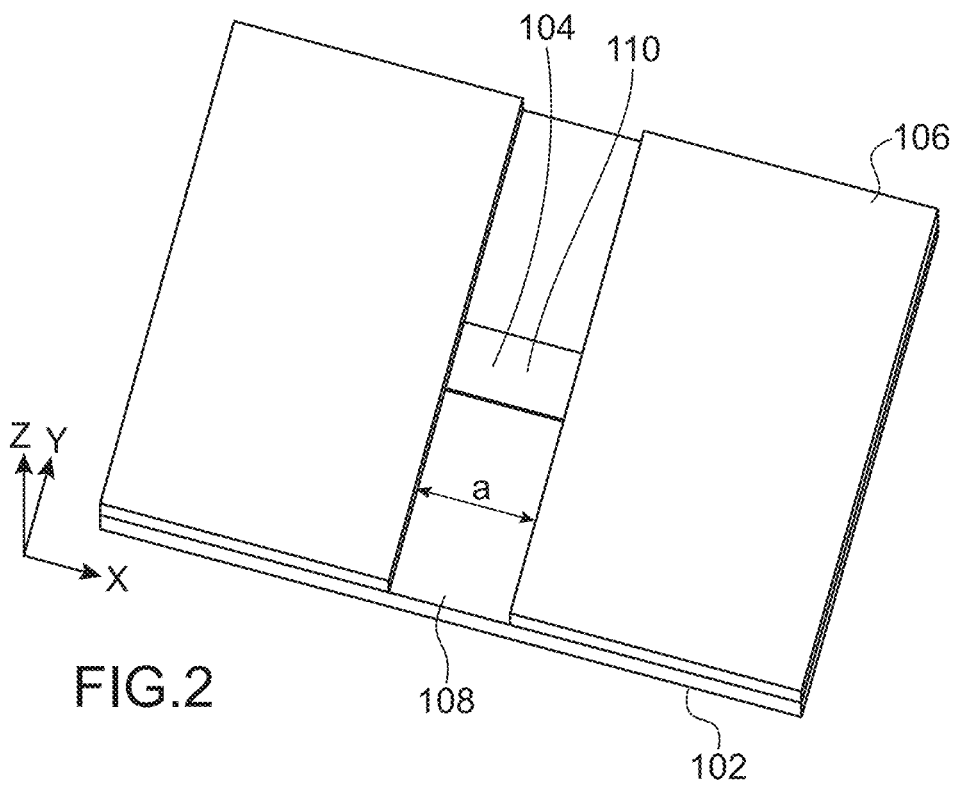

Afterwards, a graphoepitaxy guide 106 is formed over the semiconductor layer. In FIG. 2, since the semiconductor layer has been etched to form the nanowire 104, the guide 106 is formed over portions of the nanowire 104 and portions of the substrate 102.

The guide 106 forms at least one cavity 108 disposed opposite the semiconductor region in which the spin qubits are intended to be formed, and which corresponds to the guide pattern of the guide 106. In FIG. 2, the cavity 108 is located opposite a central portion 110 of the nanowire 104 in which dopants will be implanted and gates formed for form the quantum dots of the device 100.

In the example of FIG. 2, the cavity 108 has a rectangular-shaped section, in a plane parallel to the face of the nanowire 104 or of the substrate 102 over which the guide 106 is formed. The smallest sides of this section are herein parallel to the axis X and the dimension of these sides (or lateral dimensions), which corresponds to the width of the cavity 108, are referenced with the reference "a" in FIG. 2. In general, the width of the cavity 108 may be between about 50 nm and 10 µm and the cavity 108 may include a length (dimension parallel to the axis y) for example between about 50 nm and 10 µm. For example, the thickness of the guide 106, and therefore of the cavity 108, is equal to about 60 nm, and more generally between about 20 nm and 200 nm.

The guide 106 includes one or several material layer(s). For example, the guide 106 includes TiN and/or SiO$_2$ and/or SiN. The material(s) used to form the guide 106 are selected such that they have a good selectivity with respect to the etching agents that will be used later on to etch a block copolymer. The number and the thickness of the layers of the guide 106 could also vary, depending on the nature of the block copolymer and the used etching techniques For example, the guide 106 is formed by implementing steps of depositing the material(s) of the guide 106 covering the semiconductor layer (or the nanowire 104 and the substrate 102) with the material(s) intended to form the guide 106, of photolithography (for example of the Extreme UltraViolet type or EUV, or Deep UltraViolet or DUV, or by electron beam or "e-beam", or nanoprinting, etc.) and of etching this material.

Later on in the process, a block copolymer will be deposited in the cavity 108, and then self-assembled so as to form a first arrangement of at least one first pattern formed by a first phase of the block copolymer and of at least one second pattern formed by a second phase of the block copolymer.

In the embodiment described herein with reference to FIGS. 1 to 14, the used block copolymer corresponds to a di-block copolymer intended to be self-assembled so as to form a first alternating arrangement of lamellas comprising first and second phases of the copolymer and oriented parallel to one another. To obtain such an arrangement, the guide 106 is formed such that the width "a" of the cavity 108 is equal to a multiple of the period of self-assembly of the di-block copolymer into lamellas that will be used. Thus, the guide 106 is formed such that a=n.L$_0$, with L$_0$ corresponding to the period of self-assembly of the di-block copolymer into lamellas that will be assembled, and n corresponding to a natural integer number selected in particular according to the number of qubits to be formed in the nanowire 104. For example, n may be between about 2 and 20.

Afterwards, the di-block copolymer is deposited in the cavity 108. The di-block copolymer comprises two monomers A and B forming, after a self-assembly, an alternating arrangement of first lamellas comprising a first phase of the self-assembled di-block copolymer and of second lamellas comprising a second phase of the self-assembled di-block copolymer.

For example, the monomers A and B are selected from those of the list hereinbelow:

PS-b-PDMS:polystyrene-block-polydimethylsiloxane; PS-b-PDMSB; PMMA-b-PDMSB; PS-b-PMAPOSS: Polystyrene-b-poly(methyl acrylate)POSS; PMMA-b-PMAPOSS: Poly(methyl methacrylate)-b-poly(methyl acrylate) POSS; PS-b-PFS: Poly(styrene)-b-poly (ferrocenyldimethylsilane); PS-b-PI-b-PFS: Poly(styrene)-b-poly(isoprene)-b-poly(ferrocenyldimethylsilane); P2VP-b-PDMS: Poly(2-vinylpyridine)-b-poly(dimethyl siloxane); PTMSS-b-PLA: poly(trimethylsilylstyrene)-b-poly(D,L-lactide); PS-b-PDMS: Poly(styrene)-b-poly(dimethylsiloxane); PLA-b-PDMS: poly(D,L-lactide)-b-poly(dimethylsiloxane); PAcOSt-b-PSi2St: Poly(4-acetoxystyrene)-b-poly(4-(Bis(trimethylsilyl)methyl)styrene); PS-b-P(DMS-r-VMS): Polystyrene-b-poly(dimethylsiloxane-r-vinylmethylsiloxane); 1,2-PB-b-PDMS: 1,2-polybutadiene-b-poly(dimethyl siloxane); PS-b-PLA: polystyrene-block-polylactic acid; PS-b-PEO: polystyrene-block-poly(ethylene oxide); PS-b-PMMA-b-PEO: polystyrene-block-poly(methyl methacrylate)-block-poly(ethylene oxide); PS-b-P2VP: polystyrene-block-poly(2vinylpyridine); PTMSS-b-PMOST poly(trimethylsilylstyrene)-block-poly(4-methoxystyrene); PtBS-b-PMMA: poly(4 tert butyl styrene)-b-Poly(methyl methacrylate); PCHE-b-PMMA polycyclohexane-b-Poly(methyl methacrylate); PS-b-P4VP: polystyrene-block-poly(4vinylpyridine); PTMSS-b-PDLA; PS-b-PFS; PS-b-MH.

For example, the di-block copolymer is deposited by spin-coating or, alternatively, by chemical vapor deposition, or CVD.

Afterwards, the block copolymer deposited in the cavity 108 is self-assembled. For example, this self-assembly corresponds to the implementation of an annealing-type heat treatment for a time period between about 1 min and 30 min, at a temperature between about 200° C. and 250° C. According to a particular embodiment, the annealing is implemented for about 2 min at 230° C. Advantageously, the temperature and the duration of annealing are optimised according to the thickness of the block copolymer layer deposited in the cavity 108. The thicker the copolymer layer, the greater will be the annealing duration and/or temperature. For example, for a PS-b-PMMA-type di-block copolymer layer with a thickness equal to 20 nm, the annealing could be implemented over a time period of about 2 min. When this layer has a thickness equal to 150 nm, the duration of annealing may be equal to about 15 min.

Alternatively, depending on the used copolymer, the self-assembly could be obtained by a treatment other than an annealing, for example an exposure to a solvent atmosphere or an exposure to light.

Figure 3:
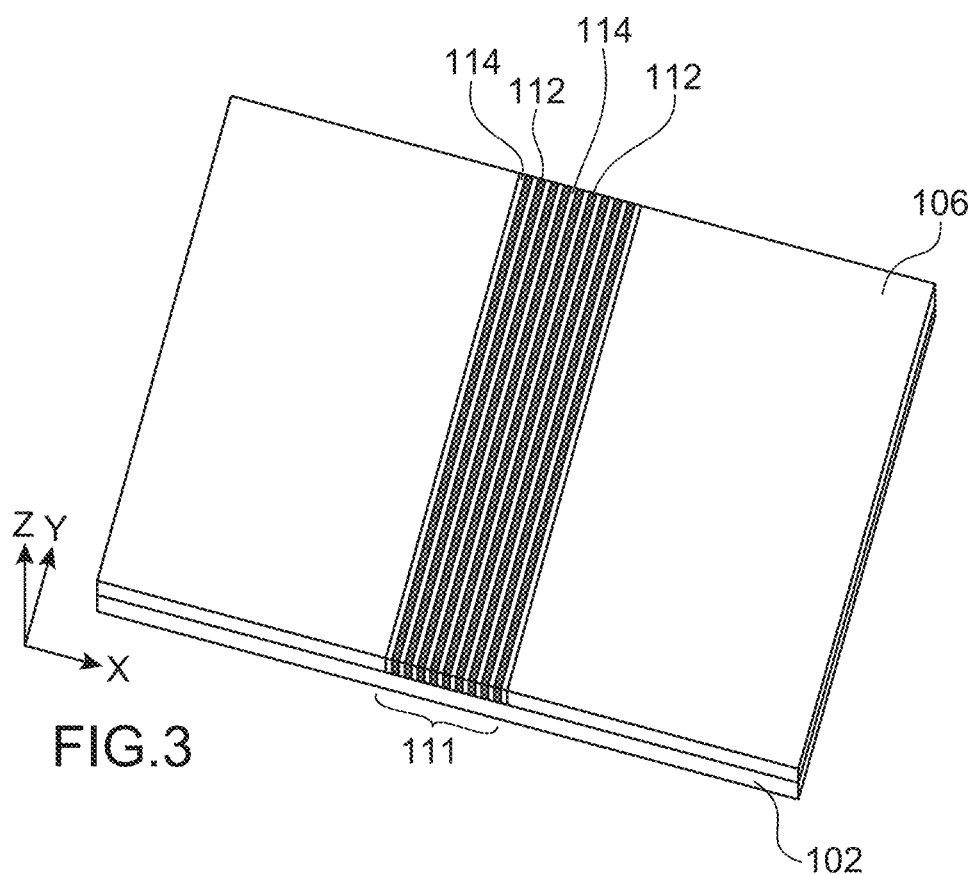

With the implementation of the self-assembly, the di-block copolymer forms a first alternating arrangement 111 of first lamellas 112 comprising a first phase of the assembled di-block copolymer and of second lamellas 114 comprising a second phase of the assembled di-block copolymer (cf. FIG. 3). The first and second lamellas 112, 114 are oriented along the length of the cavity 108, that is to say they have their largest dimension oriented perpendicularly to the width "a" of the cavity 108. This arrangement and this orientation of the first and second lamellas 112, 114 is obtained because the value of the width "a" of the cavity 108 is equal to a multiple of the period $L_0$ of self-assembly of the used di-block copolymer into lamellas. For example, the width (dimension according to the axis X in the example described herein) of each of the obtained first and second lamellas 112, 114 is equal to about 20 nm. More generally, the width of each of the first and second lamellas 112, 114 depends in particular on the molar as of the used di-block copolymer. The greater this molar mass, the larger will be the width of the lamellas 112, 114. The length of the first and second lamellas 112, 114 is equal to the length of the cavity 108.

Figure 4:
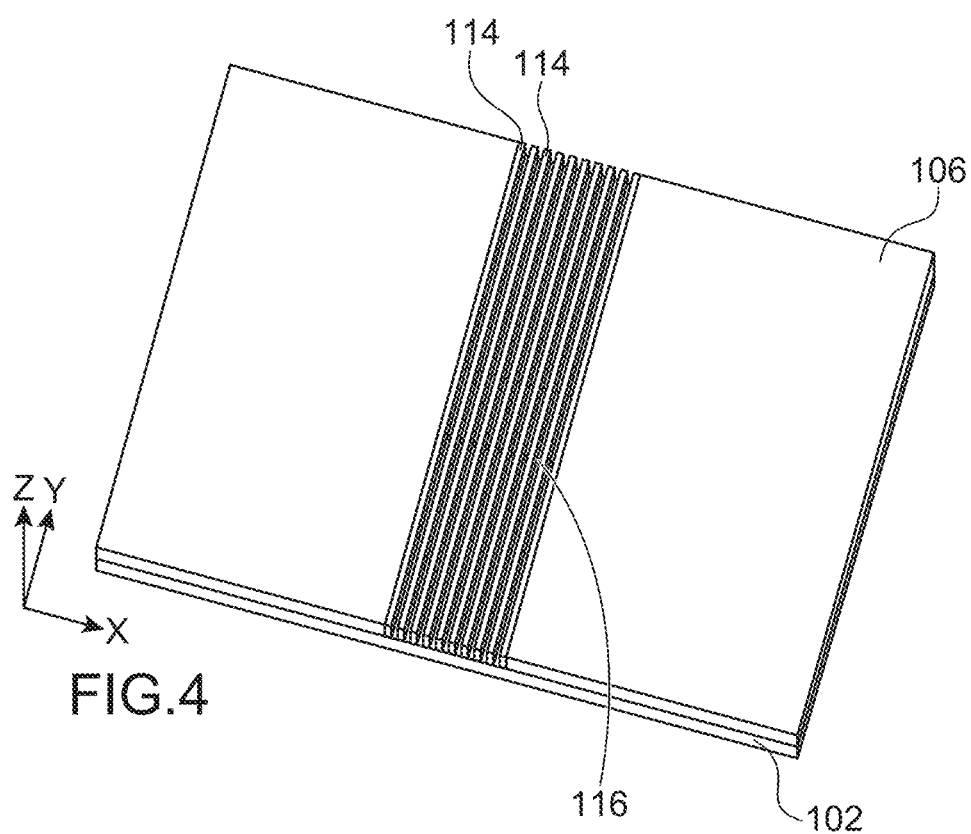
Figure 5:
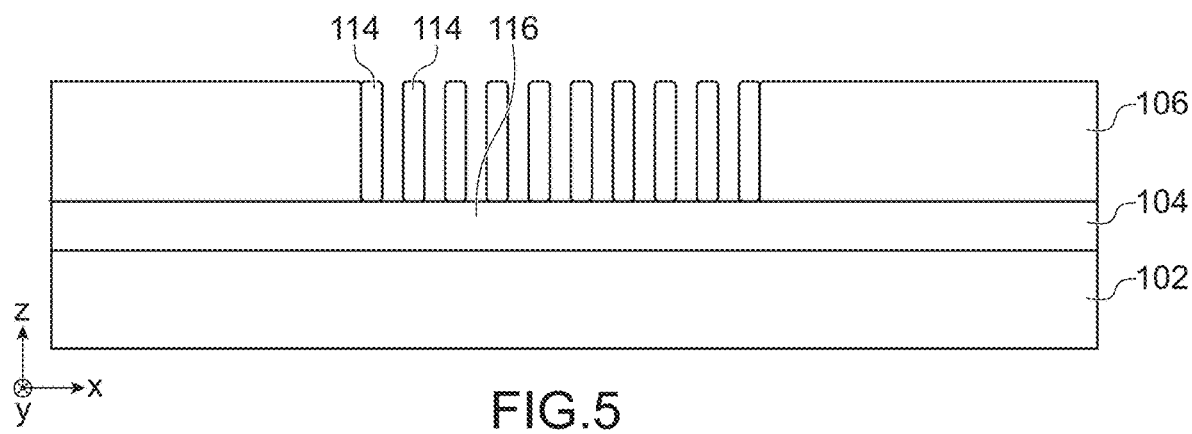

Afterwards, a removal of the first lamellas 112 is carried out (cf. FIG. 4). This removal is carried out by implementing an etching that is selective with respect to the second lamellas 114, and also selective with respect to the material(s) of the guide 106 in order not to damage the guide 106. For example, such an etching corresponds to a plasma etching. According to a particular example, when the first lamellas 112 include PMMA and the second lamellas 114 include PS, an $O_2$ plasma could be used to remove the first lamellas 112. Upon completion of this etching, portions 116 of the nanowire 104 (or of the semiconductor layer when this layer is not etched before forming the guide 106) are no longer covered with the first lamellas 112, each portion 116 of the nanowire 104 being covered before with only one of the first lamellas 112. FIG. 5 shows a sectional view of the structure obtained at this level in a sectional plane parallel to the plane (X,Z) and passing through the nanowire 104.

Afterwards, dopants are implanted in the portions 116 of the nanowire 104. For example, the implanted dopants correspond to phosphorus atoms. Alternatively, other types of dopants may be implanted, such as $^{209}$Bi or $^{77}$Se atoms.

This implantation of dopants may be carried out by ion implantation. In this case, the dose, the angle of the incident beam (also called "tilt") and the energy of the beam are selected so as to have only one dopant, or, failing that, a limited number of dopants close to 1, and advantageously less than 10, in each of the portions 116 of the nanowire 104. For example, when the second lamellas 114 have a thickness equal to about 60 nm, the ion implantation may be implemented with an energy between about 1 and 10 keV, with an angle of inclination between 0 and 7°, and with a dose between $1.10^{11}$ and $1.10^{12}$ at/cm$^2$.

Figure 6:
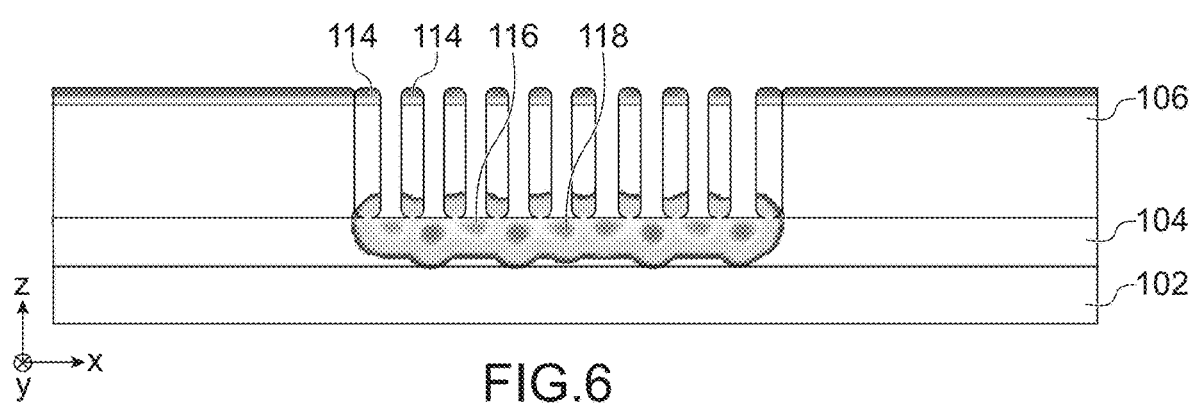

FIG. 6 shows a simulation image showing dopants 118 implanted in the portions 116 of the nanowire 104.

Afterwards, the second lamellas 114 are removed, for example by $O_2$ plasma etching.

Figure 7:
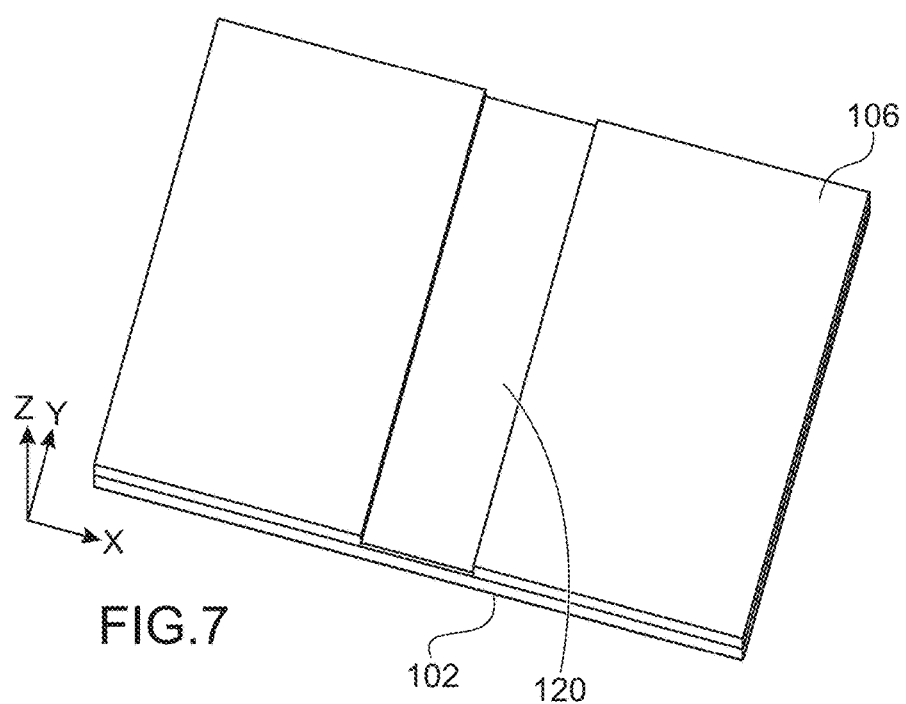
Figure 8:
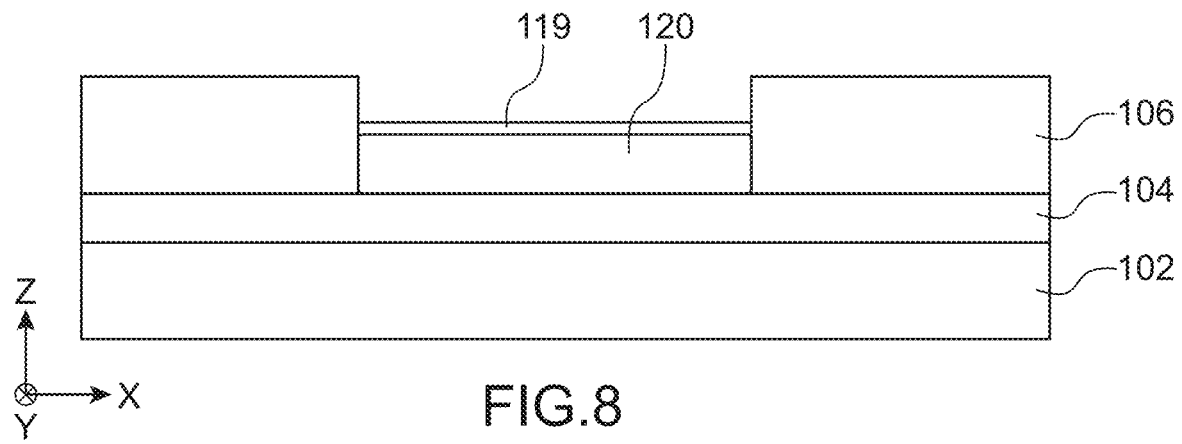
Figure 9:
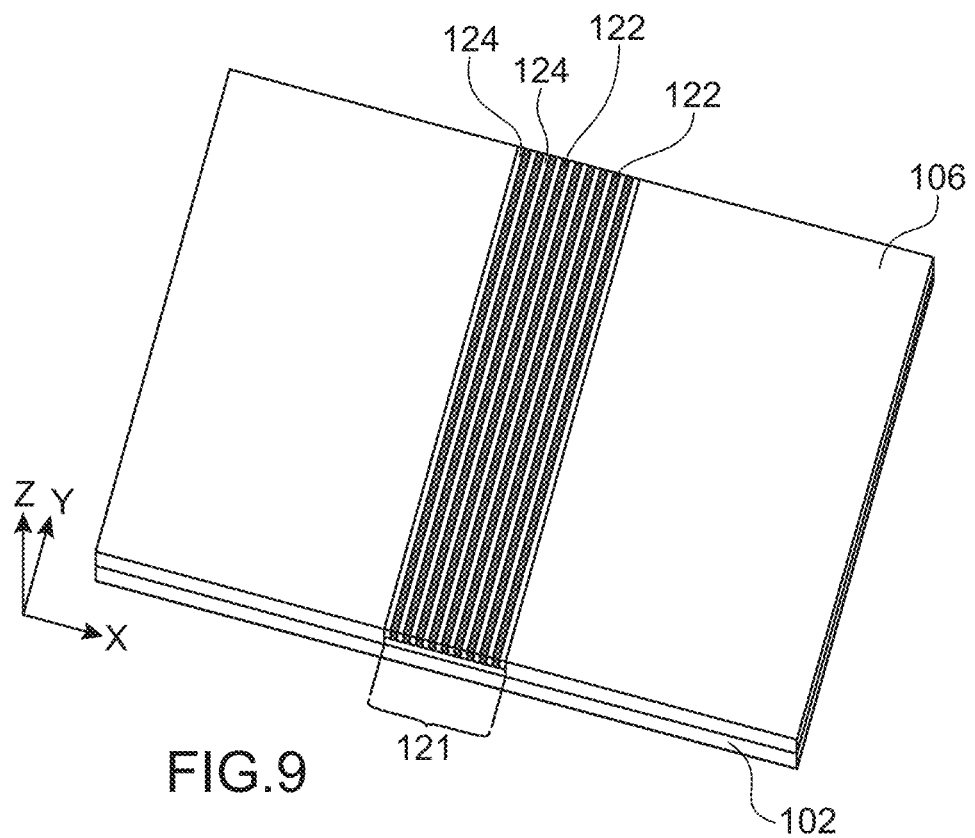

Afterwards, a gate material is formed in the cavity 108 in the form of a portion 120 (cf. FIGS. 7 and 8). To form this portion 120, the gate material is deposited for example in the cavity 108 and over the entire guide 106. Afterwards, a chemical-mechanical planarisation is implemented to suppress the gate material present over the guide 106, outside the cavity 108. Afterwards, a selective removal of the gate material may be implemented in order to remove a remaining portion of the thickness of the gate material, in order to obtain the desired thickness of the future gates of the device 100. This gate material is electrically-conductive and corresponds for example to polysilicon.

The gate material covers a gate dielectric formed over the nanowire 104 (or over the semiconductor layer when this layer is not etched prior to forming the guide 106) prior to the deposition of the gate material.

Depending on the nature of the gate material, a hard mask could be formed over this gate material before etching thereof. This is the case in particular when the gate material is polysilicon. Thus, as shown in FIG. 8, the portion 120 of the gate material is covered with a hard mask layer 119 which includes for example $SiO_2$ and/or SiN.

After forming the gate material portion 120 (and possibly the layer 119), the previously-used block copolymer is used again to form a second arrangement of patterns of different phases of the copolymer similar to the first arrangement formed before.

In the embodiment described herein, the di-block copolymer is deposited in the cavity 108, over the gate material portion 120 (or over the layer 119 if the latter covers the gate material). Afterwards, a self-assembly of this di-block copolymer is implemented, for example in the same conditions as those described before to form the first arrangement 111. Upon completion of this assembly, the self-assembled di-block copolymer forms a second alternating arrangement 121 of first lamellas 122 comprising a first phase of the self-assembled di-block copolymer and of second lamellas 124 comprising a second phase of the self-assembled di-block copolymer (cf. FIG. 9). The first and second lamellas 122, 124 are identical to the first and second lamellas 112, 114 formed before because the used di-block copolymer, as well as the shape and dimensions (in particular the width "a") of the guide 106 are identical to those used during the self-assembly of the di-block copolymer that has formed the first and second lamellas 112, 114.

Figure 10:
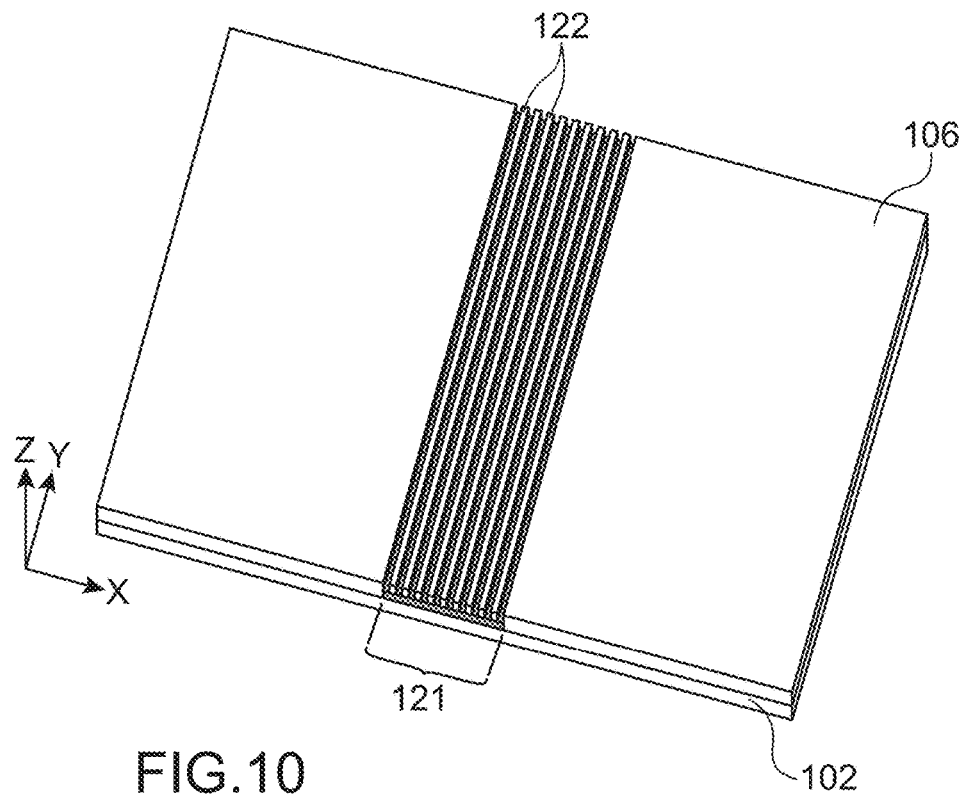

The second lamellas 124 are then removed, for example by an etching similar to that implemented before to suppress the second lamellas 114, that is to say for example an $O_2$ plasma etching (cf. FIG. 10).

Afterwards, the portion 120 of the gate material is etched in accordance with the pattern formed by the first lamellas 122 which are the only ones remaining over the portion 120. When the gate material portion 120 is covered with the layer 119, a hard mask 125 is formed at first using the first lamellas 122 as a mask. Different etching agents are used for etching the layer 119 and that of the gate material.

Figure 11:
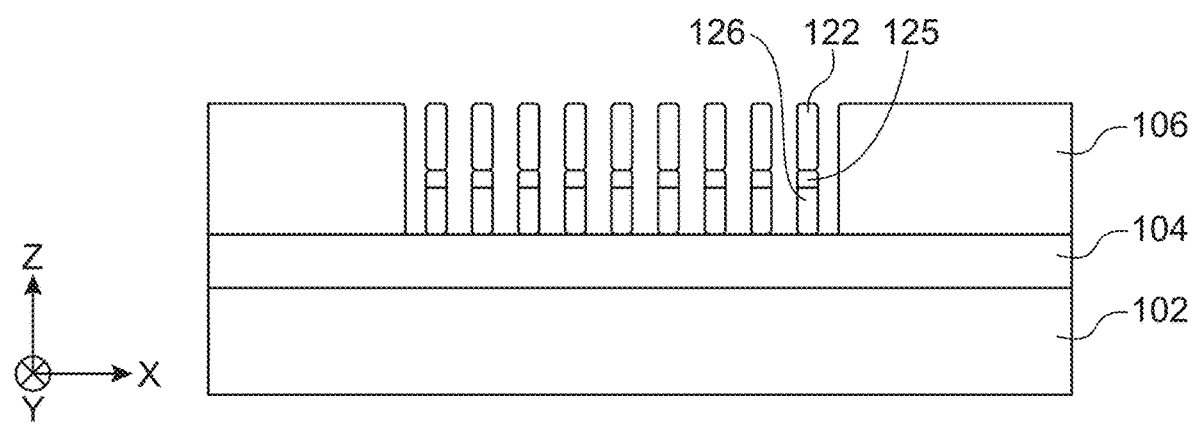

Upon completion of etching of the gate material of the portion 120, the remaining portions of the portion 120 form gates 126 covering the semiconductor portions 116 into which the dopants have been implanted before (cf. FIG. 11).

Figure 12:
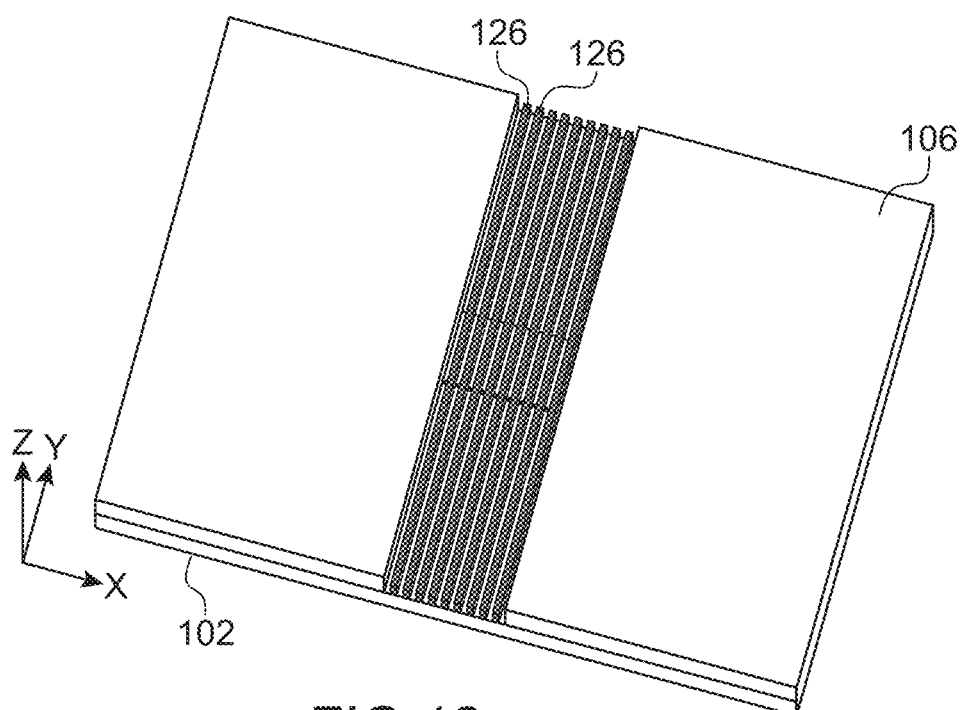

Afterwards, the first lamellas 122 are removed, for example by an etching similar to that implemented to suppress the first lamellas 112 (cf. FIG. 12).

Afterwards, the guide 106 is removed (cf. FIGS. 13 and 14), for example by etching. Alternatively, the guide 106 may be kept.

Figure 13:
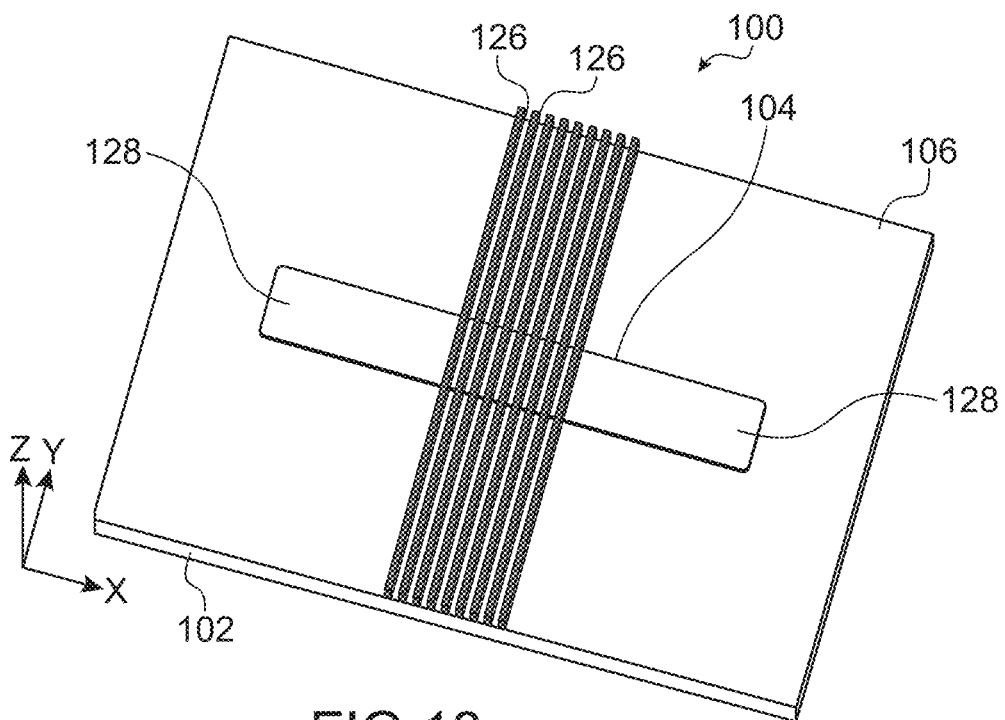
Figure 14:
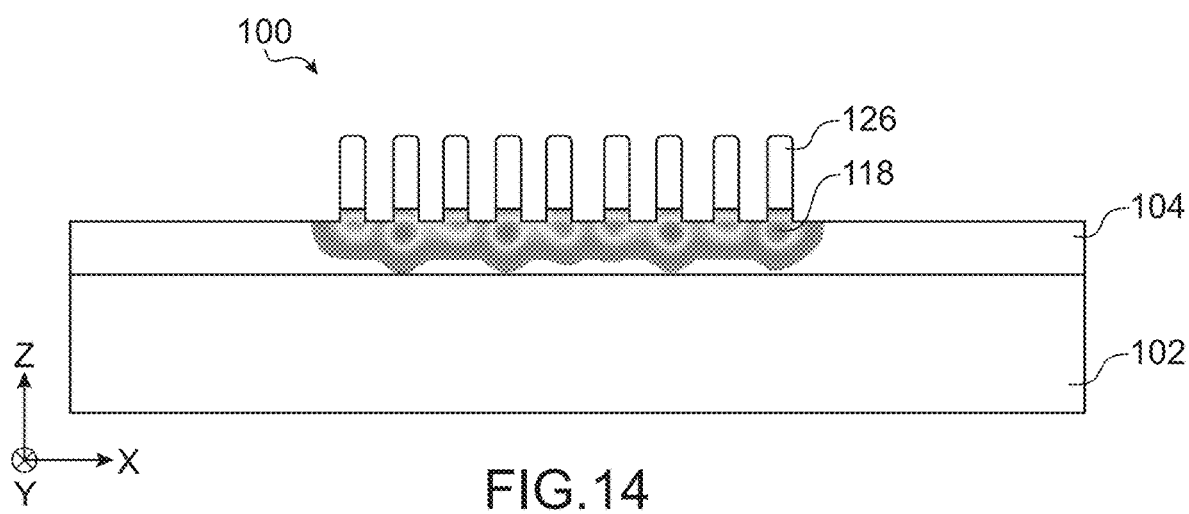

Afterwards, a doping may be implemented in the portions of the nanowire 104 that have been covered before with the guide 106, these portions being referenced with the reference 128 in FIG. 13. This doping herein allows forming charge reservoirs for the device 100. Alternatively, these doped portions 128 may be formed at the beginning of the process, before forming the guide 106.

Upon completion of these steps, the device 100 includes several quantum dots formed by the portions 116 of the nanowire 104 each covered with a control gate 126 made in a self-aligned manner on top of these portions 116.

In the above-described method the steps implemented between forming of the graphoepitaxy guide 106 and forming of the first and second lamellas 122, 124, and in particular the steps of removing the lamellas 112, 114, 122, 124 are implemented involving techniques that do not damage the graphoepitaxy guide 106, in particular techniques that do not modify the width "a" of the cavity 108. Indeed, a width "a" of the guide 106 that is identical during the assembly forming the lamellas 112, 114 and during the assembly forming the lamellas 122, 124 guarantees that the locations of the lamellas 122, 124 are identical to those of the lamellas 112, 114 when the same di-block copolymer is self-assembled. Hence, this allows obtaining a self-alignment of the gates 126 with the semiconductor portions 116 in which the dopants 118 are implanted. In particular, the steps of removing the lamellas 112, 114, 122, 124 could be carried out by implementing plasma etchings since such etchings have the advantage of etching the copolymers without deteriorating the assembly guide 106, in particular because of its high selectivity with respect to the material(s) forming the assembly guide 106.

In the particular embodiment described hereinabove, the gate material is formed in the cavity 108 after having implanted the dopants in the semiconductor. According to one variant, the gate material may be formed over the semiconductor layer before forming the graphoepitaxy guide 106. In this case, the implantation of dopants in the semiconductor is carried out through the gate material present over the semiconductor. For the implementation of this variant, the nature of the gate material and its thickness must be compatible with such a dopant implantation. For example, the gate material may correspond to a TiN layer with a thickness smaller than or equal to 10 nm. Furthermore, in this variant, it is possible not to interpose a hard mask between the gate material and the first lamellas 122.

In the description hereinabove, the used block copolymer corresponds to a di-block copolymer. Alternatively, the used block copolymer could correspond to a copolymer other than a di-block copolymer. For example, it is possible to use at least one tri-block copolymer. In this case, after the first deposition of the block copolymer in the cavity of the graphoepitaxy guide and the first self-assembly of the tri-block copolymer forming three distinct patterns each formed by one of the three phases of the copolymer, one of the three patterns formed by a first one amongst the three phases of the copolymer is removed, for example by etching, the two other patterns formed by the two other phases of the copolymer being kept. Afterwards, after the implantation of dopants, the removal of the two other patterns, the second deposition of the block copolymer and the second self-assembly of the tri-block copolymer, the two other patterns formed by the second and third phases are removed so as to keep only the first pattern formed by the first phase of the copolymer and which will used afterwards in the formation of the control gates of the qubits.

The use of a block copolymer comprising more than two phases allows achieving the implantation of dopants and forming of the control gates with patterns other than lamellas. For example, the obtained patterns used in the implantation of the dopants may correspond to a square meshing.

Furthermore, it is also possible to use a block copolymer whose self-assembly forms patterns other than lamellas, for example cylinders.

MENTIONED DOCUMENTS

B. E. Kane, "A silicon-based nuclear spin quantum computer", Nature 393, 133-137, May 14, 1998.

C. D. Hill et al., "A surface code quantum computer in silicon", Science Advances, 1, 9 (Oct. 30, 2015).

G. Tosi et al., "Silicon quantum processor with robust long-distance qubit couplings", Nature Communications, 8, 450, Sep. 6, 2017.

T. Shinada et al., "Enhancing semiconductor device performance using ordered dopant arrays", Nature 437, 1128-1131, Oct. 20, 2005.

S. R. Schofield et al., "Atomically Precise Placement of Single Dopants in Si", Phys. Rev. Lett. 91, 136104, Sep. 25, 2003.

J. J. Pla et al., "A single-atom electron spin qubit in silicon", Nature 489, 541-545, Sep. 27, 2012.

M. Koch et al., "Spin read-out in atomic qubits in an all-epitaxial three-dimensional transistor", Nature Nanotechnology, Jan. 7, 2019.

L. Oria et al. "Guided self-assembly of block-copolymer for CMOS technology: a comparative study between graphoepitaxy and surface chemical modification", SPIE 2011, Vol. 7970-24.

The invention claimed is:

1. A method for making a quantum device with nuclear spin qubits, including the implementation of the following steps:
   forming, over one face of a semiconductor layer, a graphoepitaxy guide forming at least one cavity;
   first deposition of a given block copolymer in the cavity of the graphoepitaxy guide;
   first self-assembly of the given block copolymer, forming in the cavity of the graphoepitaxy guide a first arrangement of at least one first pattern formed by a first phase of the given block copolymer and at least one second pattern formed by a second phase of the given block copolymer;
   removal of the first pattern of the first arrangement;
   implantation of dopants in portions of the semiconductor layer uncovered upon removal of the first pattern of the first arrangement;
   removal of the second pattern of the first arrangement;
   second deposition of the given block copolymer in the cavity of the graphoepitaxy guide, covering at least a gate material formed over the semiconductor layer between the removal of the second pattern of the first arrangement and the second deposition of the given block copolymer, or before forming the graphoepitaxy guide;
   second self-assembly of the given block copolymer, forming in the cavity of the graphoepitaxy guide a second arrangement of at least one first pattern formed by the first phase of the given block copolymer and of a second pattern formed by the second phase of the given block copolymer, similar to those of the first arrangement;
   removal of the second pattern of the second arrangement;
   etching of first portions of the gate material uncovered upon removal of the second pattern of the second arrangement, such that remaining second portions of the gate material located beneath the first pattern of the second arrangement form gates for controlling the qubits;
   removal of the first pattern of the second arrangement.

2. The method according to claim 1, wherein the given block copolymer is a di-block copolymer.

3. The method according to claim 1, wherein the cavity includes, in a plane parallel to the face of the semiconductor layer a lateral dimension equal to a multiple of a period of self-assembly into lamellas of the given block copolymer, and wherein the first and second arrangements correspond to alternating arrangements of first lamellas corresponding to the first pattern and of second lamellas corresponding to the second pattern.

4. The method according to claim 3, wherein the semiconductor layer is disposed over a substrate, and the method further includes, before making the graphoepitaxy guide, an etching of the semiconductor layer such that at least one remaining portion of the semiconductor layer forms a nanowire having a largest dimension that is parallel to the lateral dimension of the cavity.

5. The method according to claim 1, further including the implementation of a doping of portions of the semiconductor layer different from those uncovered upon removal of the first pattern of the first arrangement.

6. The method according to claim 1, wherein the first self-assembly and/or the second self-assembly of the given block copolymer includes the implementation of an annealing of the given block copolymer.

7. The method according to claim 1, wherein the implantation of dopants includes the implementation of an ion implantation.

8. The method according to claim 1, wherein the gate material is formed over the semiconductor layer between the removal of the second pattern of the first arrangement and the second deposition of the given block copolymer and includes polysilicon, or wherein the gate material is formed over the semiconductor layer before forming of graphoepitaxy guide and includes polysilicon and/or a metallic material whose thickness is such that the implantation of dopants could be carried out through the gate material.

9. The method according to claim 1, wherein the method comprises a deposition of a hard mask layer over the gate material before the second deposition of the given block copolymer, and further including, between the removal of the second pattern of the second arrangement and the etching of the first portions of the gate material, an etching of portions of the hard mask layer previously covered with the second pattern of the second arrangement.

10. The method according to claim 1, wherein the semiconductor layer includes isotopically-purified silicon 28.

11. The method according to claim 1, wherein the dopants implanted in the first portions of the semiconductor layer correspond to phosphorus atoms.

* * * * *